United States Patent
Nodake

(10) Patent No.: US 10,514,016 B1
(45) Date of Patent: Dec. 24, 2019

(54) CIRCUIT AND METHOD FOR SOFT SHUTDOWN OF A COIL

(71) Applicant: SEMICONDUCTOR COMPONENTS INDUSTRIES, LLC, Phoenix, AZ (US)

(72) Inventor: Yasuhiro Nodake, Oizumi-machi (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/045,469

(22) Filed: Jul. 25, 2018

(51) Int. Cl.
F02P 7/077 (2006.01)
F02P 17/12 (2006.01)
F02P 9/00 (2006.01)
H03K 17/567 (2006.01)

(52) U.S. Cl.
CPC ............ *F02P 7/077* (2013.01); *F02P 9/002* (2013.01); *F02P 17/12* (2013.01); *H03K 17/567* (2013.01)

(58) Field of Classification Search
None
See application file for complete search history.

(56) References Cited

U.S. PATENT DOCUMENTS

| | | | |
|---|---|---|---|
| 7,080,639 B1 * | 7/2006 | Pattantyus | F02P 3/0435 123/651 |
| 7,293,554 B2 * | 11/2007 | Moran | F02P 3/0453 123/605 |
| 8,161,942 B2 * | 4/2012 | Lei | F02P 11/025 123/146.5 B |
| 8,402,954 B2 * | 3/2013 | Matsuda | F02P 9/005 123/143 B |
| 9,249,774 B2 * | 2/2016 | Huberts | F02P 17/12 |
| 9,273,626 B2 * | 3/2016 | Gillberg | F02D 41/20 |
| 9,670,894 B2 * | 6/2017 | Huberts | F02P 17/12 |
| 9,739,252 B1 * | 8/2017 | Huberts | F02P 17/12 |
| 9,777,697 B2 * | 10/2017 | Glugla | F02P 17/12 |
| 9,800,024 B2 * | 10/2017 | Obe | H01T 15/00 |
| 9,890,757 B2 * | 2/2018 | Mizukami | F02P 3/0442 |
| 9,964,092 B2 * | 5/2018 | Nakamura | F02P 5/1512 |
| 10,054,101 B2 * | 8/2018 | Glugla | F02P 17/12 |
| 2004/0216724 A1 * | 11/2004 | Uruno | F02P 3/051 123/644 |
| 2004/0255920 A1 * | 12/2004 | Torrisi | F02P 3/0442 123/640 |
| 2005/0178372 A1 * | 8/2005 | Kesler | F02P 3/055 123/630 |

(Continued)

*Primary Examiner* — Dion Ferguson
*Assistant Examiner* — Srinivas Sathiraju
(74) *Attorney, Agent, or Firm* — Brake Hughes Bellermann LLP

(57) ABSTRACT

A circuit and method for gradually reducing a coil current during a shutdown period is disclosed. The circuit and method include a controller that is configured in a control loop with a current sensor that measures the current in the coil and a transistor that can be controller to limit the current in the coil. The open-loop gain of the controller is determined by a resistance of a variable feedback resistor, and the resistance of the variable feedback resistor is reduced during the shutdown period as the coil current becomes small. The reduction of the resistance maintains a suitable phase margin by lowering the open loop gain of the circuit for low coil currents. Thus during shutdown, the circuit provides control accuracy for high coil currents and control stability for low coil currents.

20 Claims, 13 Drawing Sheets

(56) References Cited

U.S. PATENT DOCUMENTS

| | | | |
|---|---|---|---|
| 2006/0017507 A1* | 1/2006 | Nodake | H03G 3/3026 |
| | | | 330/279 |
| 2006/0022609 A1* | 2/2006 | Yukutake | F02P 3/0552 |
| | | | 315/209 T |
| 2006/0213489 A1* | 9/2006 | Moran | F02P 3/0453 |
| | | | 123/651 |
| 2009/0058520 A1* | 3/2009 | Nodake | H03F 1/30 |
| | | | 330/86 |
| 2015/0112573 A1* | 4/2015 | Huberts | F02P 17/12 |
| | | | 701/102 |
| 2015/0176558 A1* | 6/2015 | Glugla | F02P 17/12 |
| | | | 123/294 |
| 2016/0097368 A1* | 4/2016 | Huberts | F02P 17/12 |
| | | | 701/102 |
| 2016/0134085 A1 | 5/2016 | Obe et al. | |
| 2017/0058854 A1* | 3/2017 | Nakamura | F02P 5/1512 |
| 2017/0268476 A1* | 9/2017 | Huberts | F02P 17/12 |
| 2018/0023531 A1* | 1/2018 | Glugla | F02P 17/12 |
| | | | 123/294 |

* cited by examiner

CIRCUIT AND METHOD FOR SOFT SHUTDOWN OF A COIL

FIELD OF THE DISCLOSURE

The present disclosure relates generally to an ignition system and more specifically, to a circuit and method for shutting down (i.e., discharging) an ignition coil gradually (i.e., softly) to prevent an unwanted spark.

BACKGROUND

Engines (e.g., vehicle engines) may have an ignition system for starting. Generally speaking, the ignition system includes a battery that is connected to a primary coil of a step-up transformer and an ignitor switch. When the ignitor switch is closed, current flows from the battery to the primary coil. After some period, the switch is opened and the current from the battery to the primary coil is abruptly stopped. The abrupt change in current through the primary coil causes a large transient voltage across the primary coil. The transient voltage is stepped up through the transformer and because the secondary coil is in series with a spark gap, the voltage at the secondary coil produces a spark at the spark gap. In some situations, however, it is desirable to turn off the current in the primary coil (i.e., shutdown, de-energize) without creating a spark at the spark gap.

SUMMARY

In on aspect, the present disclosure describes a current limiter circuit for the soft shutdown of a coil. The current limiter circuit includes a transistor (e.g., an insulated gate bipolar transistor) that is coupled to the coil and configured to allow a coil current to flow through the switch at a current level that is based on a voltage at a terminal (e.g., the gate) of the transistor. The current limiter circuit also includes a current sensor that is coupled to the transistor that senses the current level of the coil current. The current limiter circuit also includes a controller that is configured in a control loop with the current sensor and the transistor. The controller is configured to adjust the voltage at the terminal of the transistor to reduce a difference between the sensed current level and a reference level. The open-loop gain of the controller is determined by a resistance of a variable feedback resistor. The current limiter circuit further includes a signal generator that is coupled to the controller and that generates a ramp signal. The ramp signal controls the reference level of the controller so the coil current is reduced gradually over a shutdown period. The ramp signal also controls the resistance of the variable feedback resistor so that the open loop gain of the controller is reduced over the shutdown period.

In a possible embodiment, the current limiter circuit is for an ignition coil and the reduction of the coil current gradually is to prevent an unwanted spark in the ignition coil.

In another aspect, the present disclosure describes a method for preventing an unwanted spark in an ignition coil during discharge. The method includes sensing a coil current level in the ignition coil and comparing the sensed coil current level to a reference level to determine a difference. The difference is then amplified using an inverting amplifier that has negative feedback determined by a variable feedback resistor. The method further includes controlling a gate of a transistor to limit the current level in the ignition coil based on the amplified difference. This process is repeated as the reference level is reduced according to a ramp signal in order to gradually reduce the coil current level. Additionally, the feedback resistance is reduced as the coil current level is gradually reduced, and the reduction of the feedback resistances improves (i.e., increases) the phase margin (i.e., stability) of the negative feedback system.

In a possible embodiment, the reduction of resistance is achieved by successively shorting a bank of resistors in the variable feedback resistor according to the ramp signal.

The foregoing illustrative summary, as well as other exemplary objectives and/or advantages of the disclosure, and the manner in which the same are accomplished, are further explained within the following detailed description and its accompanying drawings.

DETAILED DESCRIPTION

The present disclosure describes a circuit and method for soft shutdown of an ignition circuit (i.e., igniter circuit) that utilize a negative feedback loop with a controlled open loop gain to increase a phase margin as a coil current is reduced, which insures stability as coil currents are reduced. While variations may exists, the ignition circuit can operate in a vehicle environment (i.e., to start an engine). An example ignition circuit that can be used in the implementations described herein is shown in FIG. 1.

Figure 1:
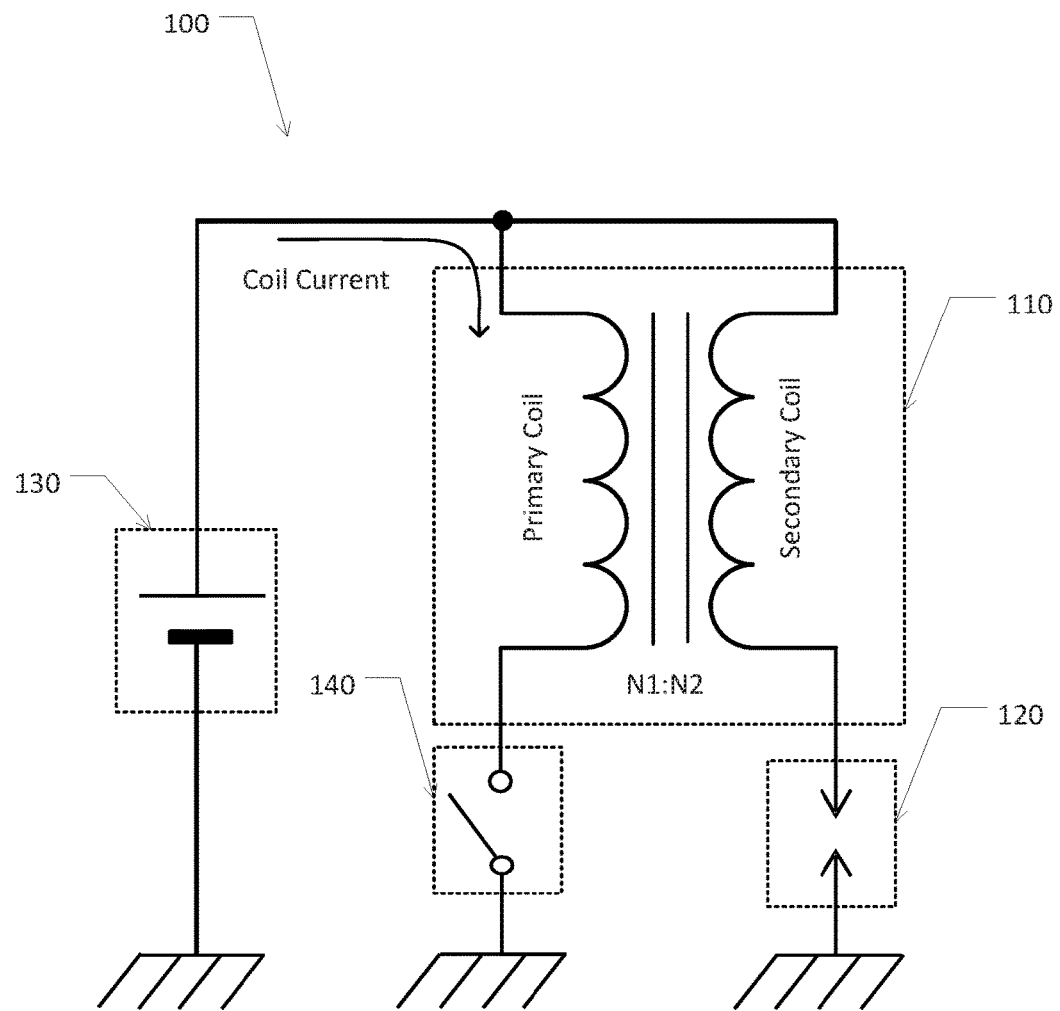
FIG. 1 is a simplified schematic of a spark ignitor circuit including an ignition coil according to an embodiment of the present disclosure.

FIG. 1 illustrates an ignition circuit 100 includes a battery 130 that supplies a coil current to a primary winding (i.e., primary coil) of a transformer 110 when a switch 140 is closed (e.g., turned ON). When switch 140 is opened (e.g., turned OFF) the coil current is stopped abruptly and a large voltage (e.g., 400 volts (V)) is created across the primary coil due to the inductance of the primary coil (i.e., V=L di/dt). This voltage at the primary coil is transformed by the transformer 110 to a higher voltage at the secondary coil (e.g., 30 kilovolts (KV)) due to a large windings ratio, N2/N1 (e.g., 50-100). The large voltage appears at a spark gap (e.g., spark plug gap) 120, and is large enough to overcome the resistance of the gap to create a spark.

In some cases, the coil current is brought to a high level for a period of time that is larger than expected or desired. For example, if a high coil current remains for a long period (e.g., greater than a timeout period, Ton) without a spark, then damage (e.g., overheating) to an ignition system could result. Accordingly, the coil current should be shut off before damage occurs. In practice, a timeout period may be defined and if a coil current remains high for a period greater than a timeout period, Ton, then the coil current is shut off.

Figure 2A:
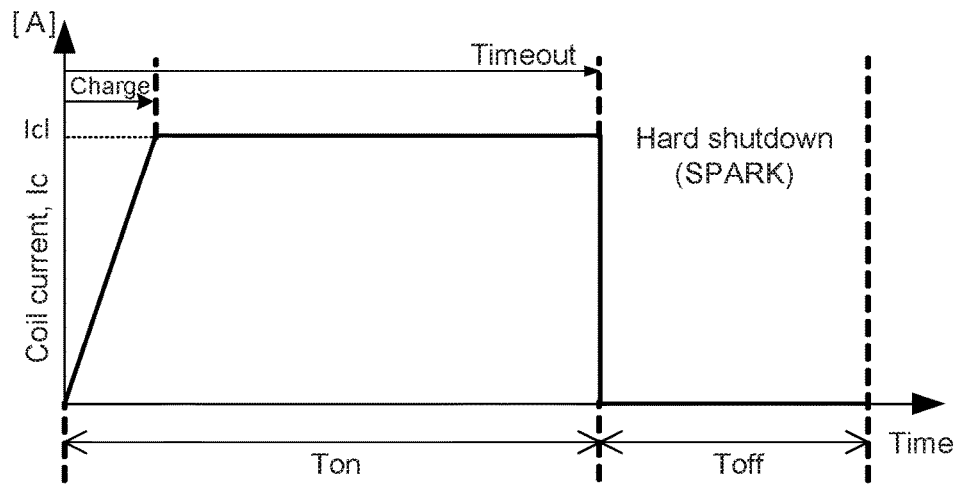
FIG. 2A is a graph of a coil current versus time illustrating a hard shutdown profile.
Figure 2B:
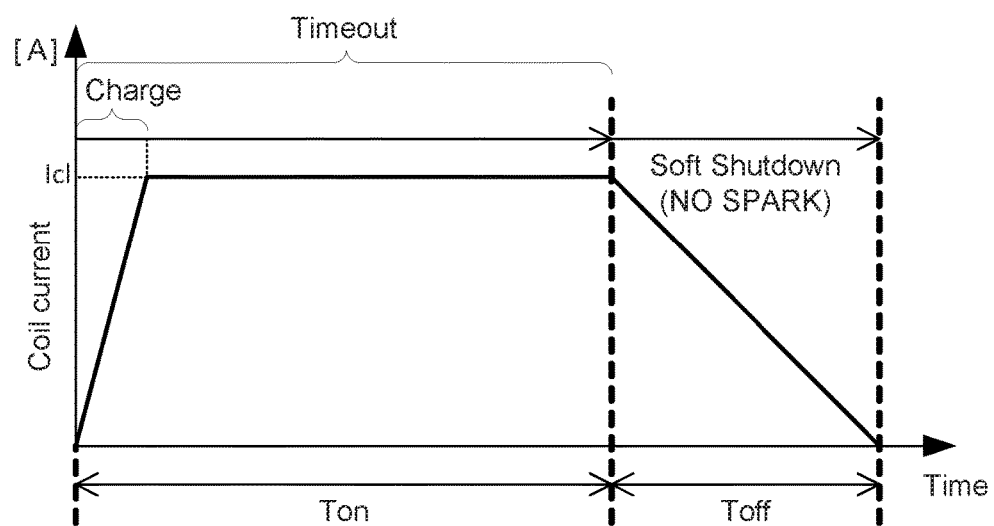
FIG. 2B is a graph of coil current versus time illustrating a soft shutdown profile.

As shown in FIGS. 2A and 2B, there are two ways to shut off the coil current after the timeout period, Ton. The first way, shown in FIG. 2A, is a hard shutdown in which the coil current is abruptly shut off (e.g., by opening a switch) after the time out period Ton. As discussed, this method produces a spark. The expiration of the time out period, Ton, however, may not be correlated with the operation/state of the engine. As a result, a spark from a hard shutdown may occur regardless of a cylinder position and an undesirable combustion may occur as a result of the abnormal spark.

In order to de-energize the coil and shut off the ignition system without a spark the coil current can be reduced gradually. FIG. 2B is a graph of a coil current associated with a simple soft shutdown. After the expiration of the timeout period, Ton, the coil current is brought to zero gradually over some shutdown (i.e., shutoff) period, Toff. Because the coil current is shutdown gradually, the voltage created across the primary coil is never made large enough to overcome the resistance at the spark gap. Thus, no spark is created. The times for Ton and Toff are selectable based on the application and the devices used. Additionally, the time for the primary coil to ramp up (i.e., charge) to steady state is not necessarily related to Toff. The present disclosure describes circuits and methods that can generally accommodate either the hard shutdown of FIG. 2A or the soft shutdown of FIG. 2B, but as will be described, can also control the coil current during shut down in a way that balances control accuracy with control stability as the coil current levels are reduced.

Figure 3:
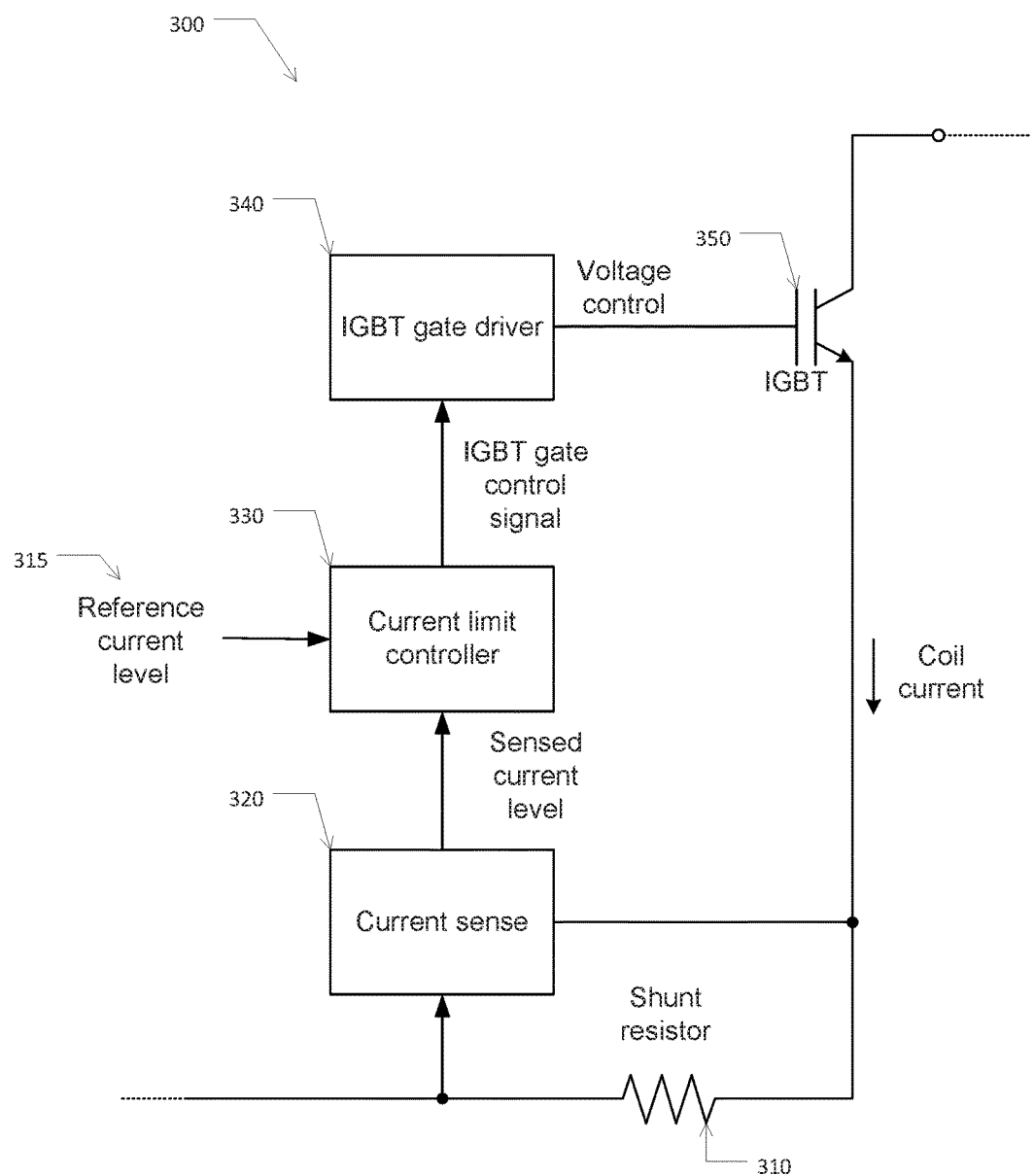
FIG. 3 is a block diagram of a current limiter for controlling a current in a coil according to an embodiment of the present disclosure.

A block diagram of the disclosed current limiter circuit 300 for controlling the coil current during shutdown is shown in FIG. 3. In the circuit, the coil current level is sensed by a shunt resistor 310 and measured by a current sense circuit 320. The measured current (i.e., sensed current level) is then compared to a reference current level (i.e., current limit level) 315 at a current limit controller 330 (i.e., controller). Based on the comparison, a difference signal (i.e., error signal) is obtained, amplified, and inverted to create an IGBT gate control signal. The IGBT gate control signal, with the aid of the IGBT gate driver 340, control the operating point of the IGBT 350 to raise/lower the coil current to according to the error signal. The gate driver 340 amplifies the current supplied to the gate of the transistor based on the gate voltage to charge/discharge the gate capacitance quickly. The gate voltage on the IGBT controls the coil current so that it never exceeds the reference current limit level (Icl) 315. This control may be utilized to perform a soft shutdown of the coil current. For example, if the reference current limit level (Icl) 315 of the control circuit 300 (i.e., current limiter circuit) is reduced gradually over a time, Toff, then the coil current will be reduced gradually as well and a soft shutdown discharge of the coil will be achieved.

Figure 4:
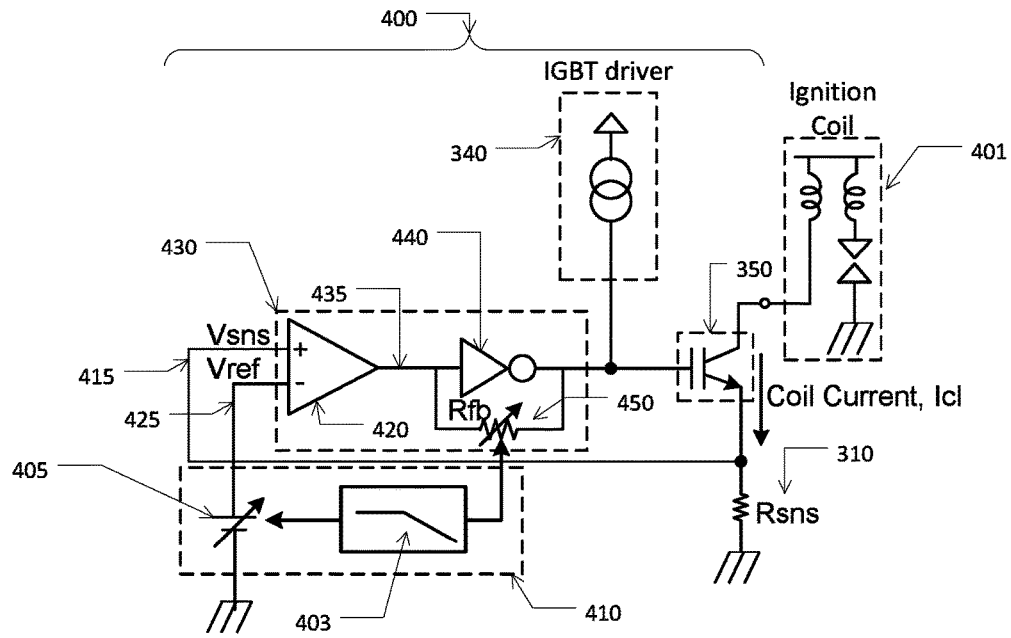
FIG. 4 is a schematic of a current limiter circuit with a variable feedback resistance for the soft shutdown of a coil according to an embodiment of the present disclosure.

A schematic of a current limiter circuit 400 according to an embodiment of the present disclosure is shown in FIG. 4. The current limiter circuit 400 is coupled to an ignition coil 401. In operation, a feedback voltage (Vsns) 415, created by a coil current (Icl) across the shunt resistor (Rsns) 310, is compared by a differential amplifier 420 to a reference voltage, Vref 425. The reference voltage, Vref, 425 results from a variable voltage source 405 controlled by a ramp signal 403 created by a signal generator 410. The resulting difference signal 435 is amplified by an inverting amplifier 440 with a gain controlled by a variable feedback resistor (Rfb) 450. The output of the inverting amplifier 440 is fed to an IGBT gate driver 340 to control the gate of the IGBT 350, which adjusts the current limit of the primary coil in the ignition coil circuit 401 (i.e., the coil current) to reduce (e.g., minimize) the difference signal 435.

In other words, the circuit includes a controller 430 that is configured in a control loop with the current sensor 310 and a transistor 350. The controller 430 is configured to adjust the voltage at the gate of the transistor 350 to reduce the difference between the sensed voltage level (Vsns) and a reference voltage level (Vref). In this configuration, the controller 430 has an open loop gain determined by parameters that include the resistance of the variable feedback resistor 450.

Figure 5:
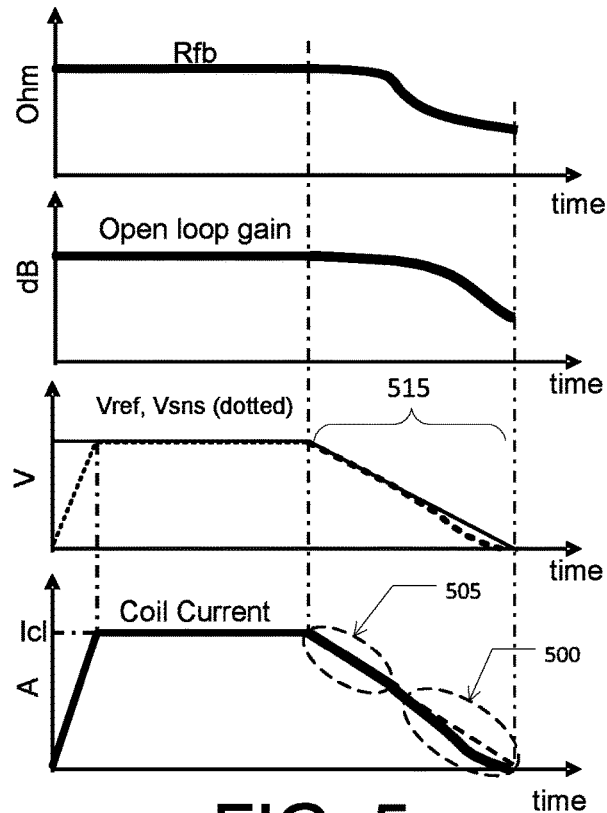
FIG. 5 are graphs of feedback resistance (Rfb), open loop gain, reference voltage (Vref), sensed voltage (Vsns), and coil current of the current limiter circuit of FIG. 4 during a soft shutdown period.

The feedback process described can be repeated (in real time) until the coil current (i.e., Vref) is brought to zero. FIG. 5 includes graphs of the sensed voltage, Vsns 415, (dotted line) and the reference voltage, Vref 425, (solid line) during a soft shutdown period 515. As can be seen, the coil current (Icl) generally follows the reference voltage as it is ramped down during the soft shutdown period 515.

As mention previously, the current limiter circuit 400 relies on a negative feedback control system. The stability of the control system may change as the controlled coil current changes. An aspect of the present disclosure is the recognition that to prevent instability as the coil current (Icl) is reduced, the open loop gain of the current limiter circuit 400 can also be reduced to increase phase margin (i.e., stability) of the current limiter circuit 400. Another aspect of the present disclosure is the recognition that the added stability comes at the expense of control accuracy and that the trade of accuracy for stability is best suited for a low current region of a soft shutdown profile where control accuracy is less important.

Reducing the feedback resistance (Rfb) 450 can reduce the open loop gain, which can improve the phase margin (i.e., stability) of the current limiter circuit 400. As mentioned, the open loop gain reduction can lead to a loss of the control accuracy due to a variety of error sources (e.g., temperature, process, IGBT gate-emitter voltage, etc.). In other words, reducing the feedback resistance (Rfb) 450 may cause the coil current to deviate from the soft shutdown profile as prescribed by Vref. This deviation could lead to unwanted sparking in a high current region 505. Thus, the disclosed current limiter circuit controls the feedback resistance (i.e., open loop gain) to strike a balance between stability in a low current region 500 accuracy in a high current region 500. The exact balance may vary based on the application and operating points.

The circuits and methods described herein offer the advantage of an improved phase margin (i.e., stability) in low a current region 500 (i.e., where stability can be problematic), while maintaining current limit accuracy in a high current region 505 (i.e., where following a soft shutdown profile is important).

In the current limiter circuit 400, the controller 430 creates a difference signal 435 (i.e., error signal) that is amplified by an inverting amplifier 440 with a gain controlled by a variable feedback resistor (Rfb) 450. The value (i.e., resistance) of the variable feedback resistor 450 is controlled by the signal generator 410 according to a ramp signal. The output of the inverting amplifier 440 is fed to an IGBT gate driver that drives the gate of the IGBT to adjust the current limit of the primary coil in the ignition coil circuit 401 to reduce the difference signal.

Various profiles (i.e., soft shutdown profiles) of measured parameters in the current limiter circuit 400 are graphed in FIG. 5. As shown, Vref, 425 can be ramped linearly down from a voltage to zero voltage over a soft shut down period 515. The precise amplitude and timing profile of Vref 425 during the soft shutdown period 515 are determined by the ramp signal 403 from a signal generator 410 and may be selected based on the application (e.g., ignition coil parameters). In addition to controlling Vref, the ramp signal 403 from the signal generator 410 also controls the resistance (Rfb) of the variable feedback resistor 450. As shown in FIG. 5, the resistance, Rfb, is gradually reduced based during the shutdown period 515. The reduction of Rfb may or may not decrease linearly, as Vref does. The exact profile of Rfb may be selected to achieve a desired balance between phase margin (i.e., stability) in the low current region 500 of the soft shutdown period and accuracy in a region (or regions) where it is more important, such as a high current region 505 of a soft shutdown period and/or a current limit period before the soft shutdown period. Additionally, the maximum and minimum feedback resistance Rfb values may be adjusted with this balance in mind as well.

The open loop gain of the circuit 400 is related to the feedback resistance (Rfb) of the inverting amplifier 440 and thus, decreases based on the decreasing value of Rfb. As mentioned previously, the reduction in the open loop gain in the low current region 500 maintains phase margin (i.e., stability) at the cost of control accuracy of the coil current. As the open loop gain is reduced, the coil current (and therefore Vsns) follow a soft shutdown profile that corresponds to Vref less accurately in the low current region 500 of the soft shutdown period than in the high current region 505 of the soft shutdown period.

Figure 6:
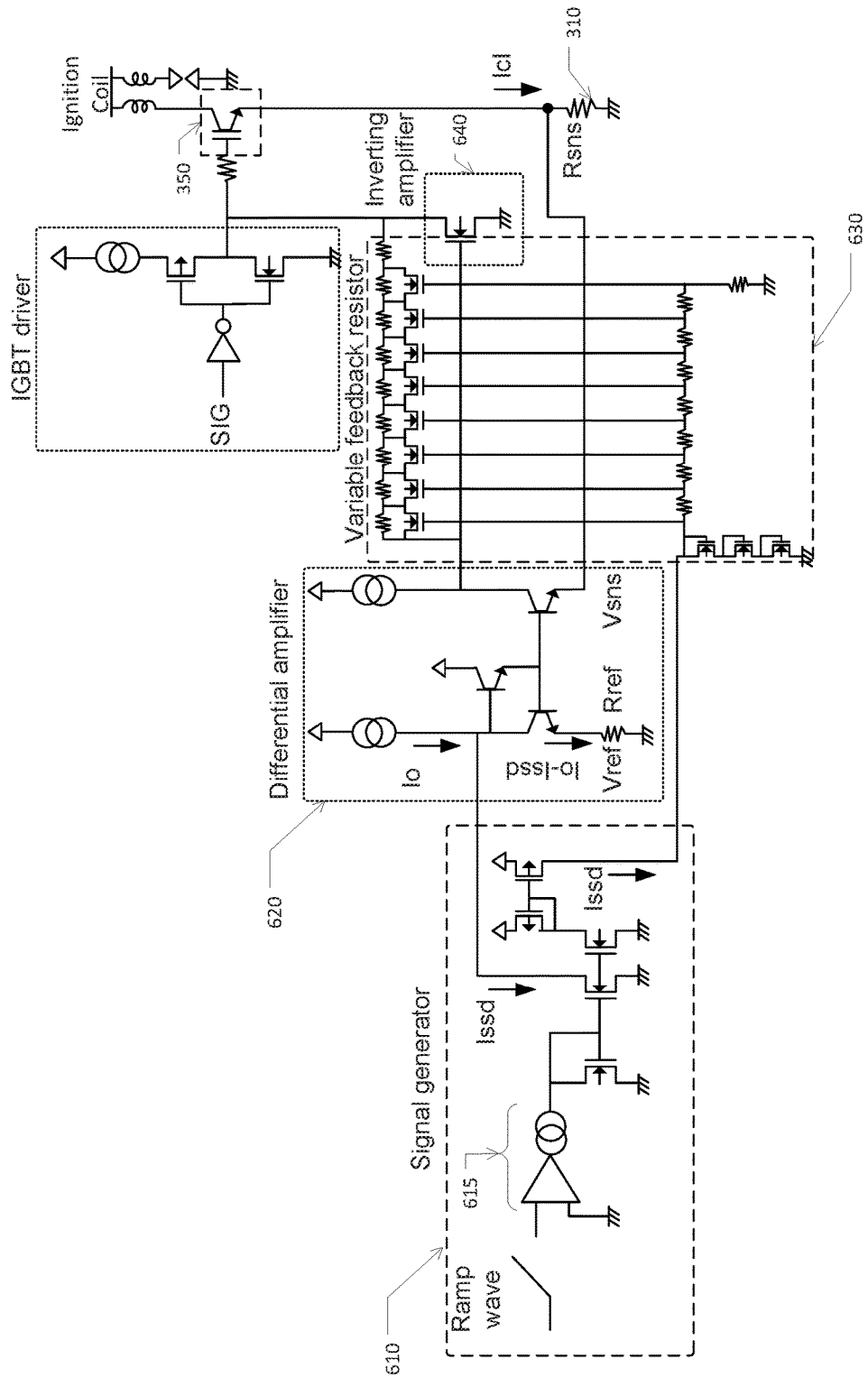
FIG. 6 is a detailed schematic of a current limiter circuit with variable feedback resistance according to a possible embodiment of the present disclosure.

FIG. 6 schematically depicts the circuit details of a possible embodiment of the variable feedback resistance current limiter circuit coupled to an ignition coil. In the circuit, a signal generator 610 includes a voltage ramp wave fed to a voltage to current converter 615 to create a corresponding soft shutdown control current, Issd. The current, Issd, is coupled out of the signal generator using a current mirror.

At a first input of the differential amplifier 620, the current (Io−Issd) flows to ground through a resistor, Rref, to produce a voltage, Vref at the differential amplifier's first input. The reference voltage, Vref, follows a soft shutdown profile. In other words, the voltage, Vref, ramps down from a high voltage (i.e., Io−Issd is large) to a low voltage (i.e., Io−Issd is small). At a second input of the differential amplifier, 620, the coil current (Icl) flows to ground through a sensing resistor (Rsns) 310 thereby creating a sensed voltage (Vsns) corresponding to the coil current. The output of the differential amplifier 620 corresponds to the difference voltage (Vsns−Vref).

The difference voltage (Vsns-Vref) is coupled to an input of an inverting amplifier 640. The inverting amplifier may be embodied variously. The inverting amplifier shown in FIG. 6 is a transistor (e.g., n-type MOSFET) with a gain that is determined by a feedback resistance (Rfb) between the drain and the gate of transistor. A high feedback resistance corresponds to a high gain and a low feedback resistance corresponds to a low gain (e.g., zero resistance corresponds to zero gain-diode).

After the inverting amplifier 640, the inverted and amplified output voltage is applied at the gate of the IGBT 350 and effectively pulls down or pulls up the output of the IGBT driver to control the coil current according to the amplified and inverted voltage difference. For example, if the difference Vsns-Vref is positive then the coil current is reduced. Thus, if Vref is a ramp voltage that decreases to zero of a period (Toff) then the coil current will, ideally, follow the same ramp profile to zero over the same shutdown period (Toff). It should be noted that the present disclosure envisions that signals other than ramp waves could be used to control the shutdown of the coil.

Figure 7:
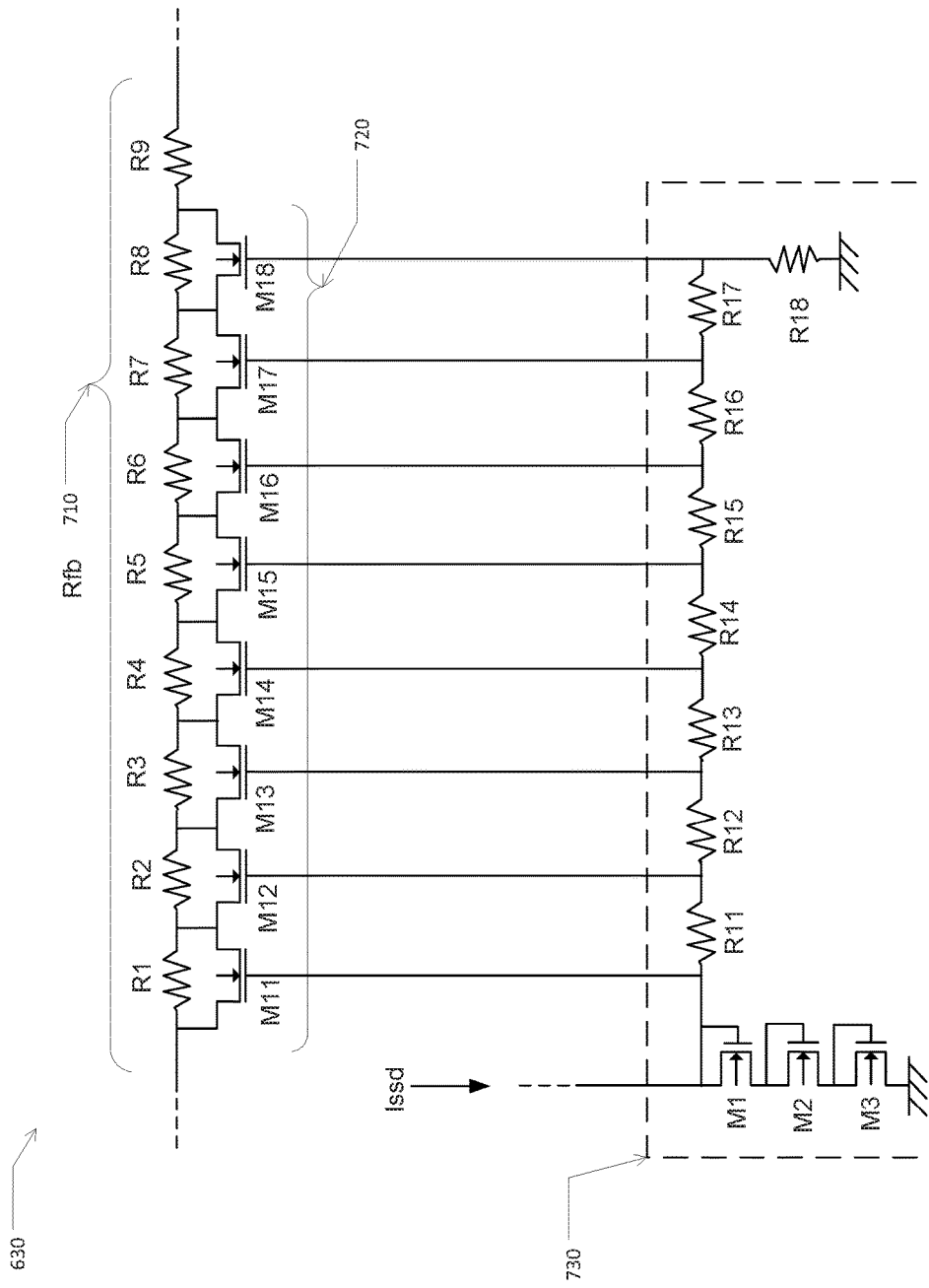
FIG. 7 is a section of the schematic of FIG. 6 showing the variable feed back resistor according to a possible embodiment of the present disclosure.

An aspect of the disclosure is the open loop gain of the control loop (i.e., the gain of the inverting amplifier) is lower as the coil current reaches a low current region of a soft shutdown profile. The open loop gain is reduced by decreasing the feedback resistance value Rfb of the variable feedback resistor 450. The variable feedback resistor 450 may be embodied and controlled in various ways and while the present disclosure presents several possible embodiments, variations (e.g., number of resistors, values of each resistor, etc.) are understood to be within the cope the of the present disclosure. FIG. 7 is a detailed schematic of the variable feedback resistor 630 shown in the current limiter circuit of FIG. 6.

As shown in FIG. 7, the variable feedback resistor 630 of FIG. 6 consists of a bank of series connected resistors (R1-R8) 710 that are each connected in parallel with one transistor in of a bank of transistors (M11-M18) 720. When a particular transistor in the bank of transistor is turned ON, the resistor that is in parallel with the particular transistor is shorted to reduce the overall series resistance of the variable feedback resistor. For example, R1 is connected between the source and drain of M11. If the voltage at the gate of M11 turns the transistor ON then the impedance between the source and drain of M11 is much smaller than the resistance of R1. Accordingly R1 is shorted and the overall feedback resistance becomes R2+R3+R4+R5+R6+R7+R8+R9. The additional resistor, R9, may be included without any corresponding transistor to set the minimum feedback resistance (i.e., open loop gain) of the amplifier.

To gradually reduce the feedback resistance Rfb, the transistors can be successively turned ON over the soft shutdown period. There are a variety of ways to control the transistors 720 according to the soft shutdown profile. While the disclosure presents several possible embodiments of transistor control circuits, these do not comprise an exhaustive list and other possible embodiments or variations (e.g., transistor type, connection configuration, etc.) are considered within the scope of the present disclosure.

One possible embodiment of a transistor control circuit 730 is shown in FIG. 7. As shown, the circuit receives the ramped soft shut down control current, Issd, from the signal generator (e.g., via a current mirror in the signal generator). The transistor control circuit 730 includes a voltage divider (R11-R18) that is tapped at different voltages by a terminal (e.g., the gate, the base, etc.) of each of the transistors (M11-M18) in the bank of transistors 720. The tap points provide voltages that increase by the voltage drop across each resistor in the voltage divider. The gate-drain connected transistors (M1, M2, and M3) operate as series connected diodes are used as part of the circuit because a current, Issd, is received at the voltage divider instead of a voltage.

Figure 8:
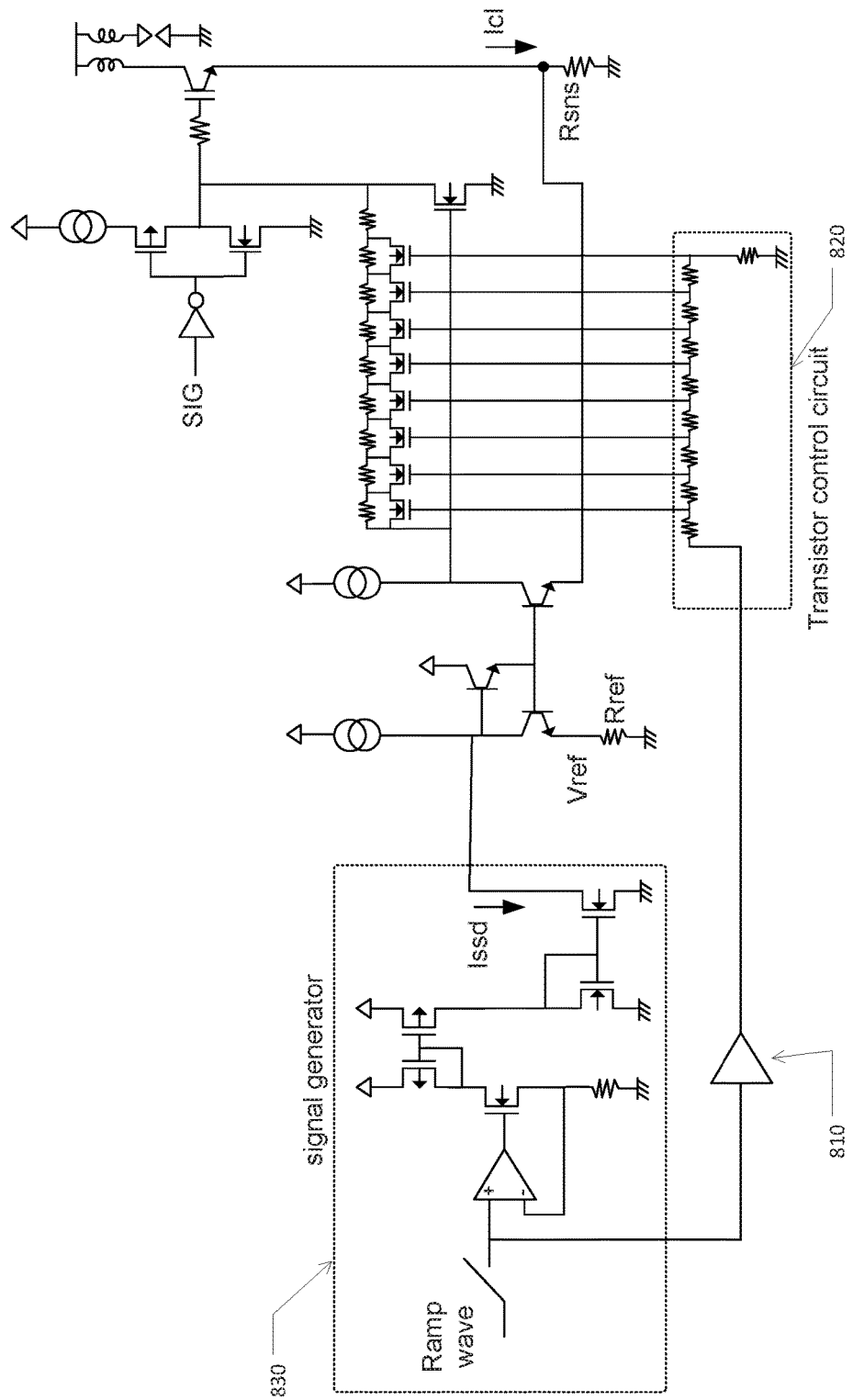
FIG. 8 is a detailed schematic of a current limiter circuit with variable feedback resistance according to another possible embodiment of the present disclosure.

FIG. 8 schematically depicts the circuit details of another possible embodiment of the variable feedback resistance current limiter circuit coupled to an ignition coil. In the circuit, a voltage ramp wave from the signal generator 830 is coupled to a transistor control circuit via a buffer amp 810. The transistor control circuit 820 includes to a bank of series connected resistors acting as a voltage divider to produce the voltage taps that control the transistors to sequentially turn on as the ramp wave signal progresses from low to high. Like the previous embodiment, the voltage divider is tapped at different voltages by the gates of each of the transistors in the bank of transistors. The tap points provide voltages that increase by the voltage drop across each resistor in the voltage divider. Accordingly, the transistors may be turned on in succession as the ramp wave voltage is increased.

Figure 9:
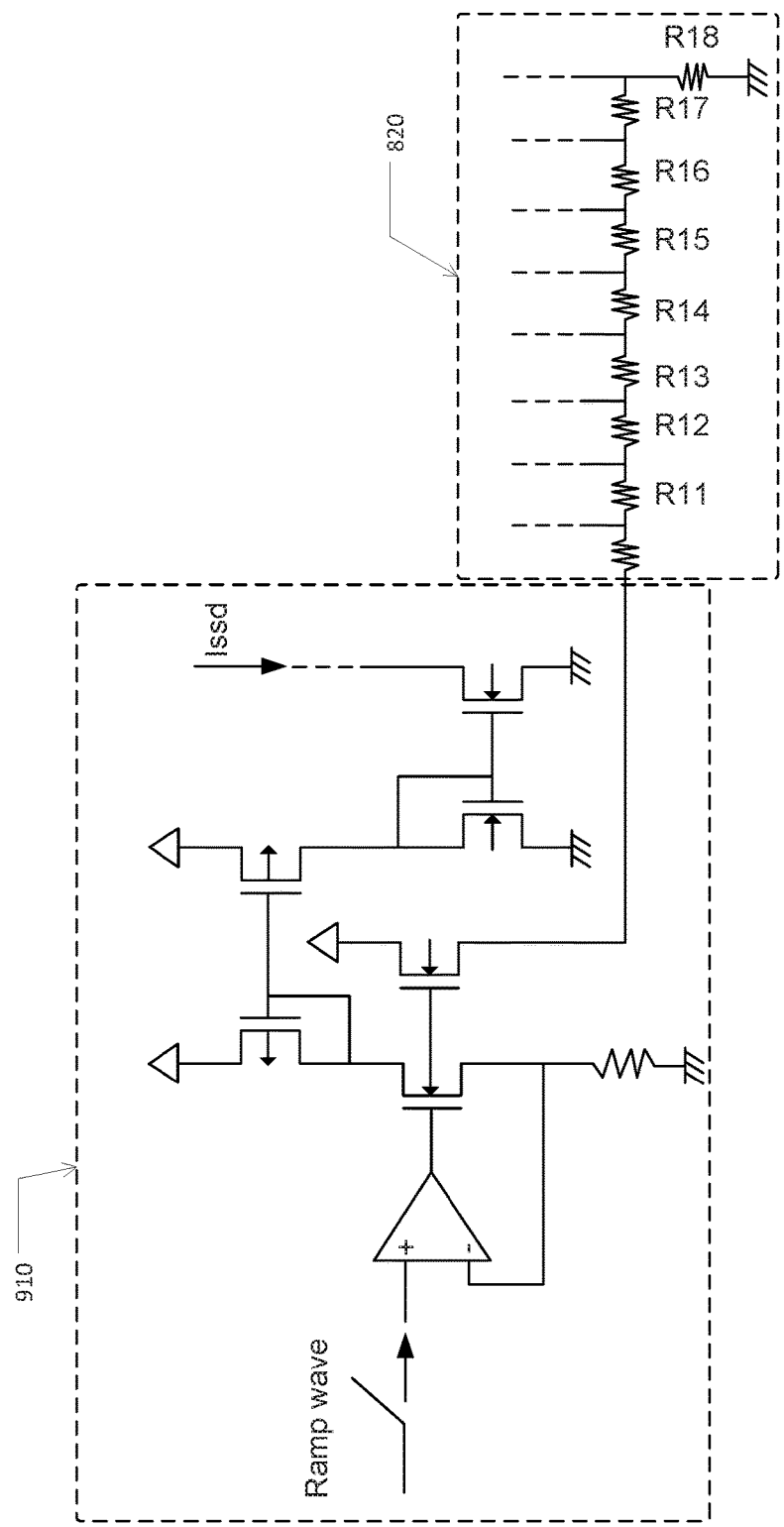
FIG. 9 is a schematic showing a possible variation of sections of the current limiter circuit with variable feedback resistance of FIG. 8.

A possible variation to the circuit of FIG. 8 is shown in FIG. 9. Here, the voltage ramp wave is obtained from a node in the signal generator circuit, but additional variations are possible. For example, thus far it has been assumed that the signal generator provides a ramp signal for control of both the reference voltage (Vref) and the feedback resistance (Rfb) together. The control of the feedback resistance, however, may be controlled separately. For example, a dedicated controller may be used to provide the signal necessary to control the transistors in the variable feedback resistor during soft shutdown independently of the control of the coil current. In general, various adaptations and modifications of the variable feedback resistance current limiter circuits described above can be configured without departing from the scope and spirit disclosure. In other words, as long as Rfb is reduced during Toff, phase margin for low coil currents can be maintained. The particular shape and timing of the resistance reduction may be practiced variously within the scope of the present disclosure.

Figure 10A:
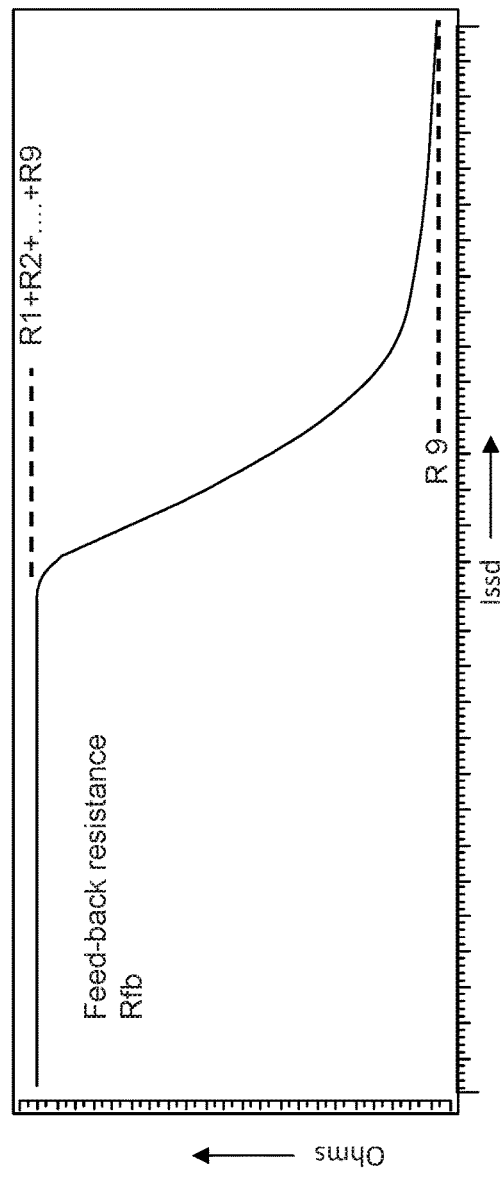
FIG. 10A is a graph of feedback resistance provided by the variable feedback resistor of FIG. 7 during a shutdown period as the soft shutdown current is increased.

The particular reduction of the resistance of the variable feedback resistor of FIG. 7 during a shutdown transition (i.e., as the soft shutdown current, Issd, is increased) is shown in FIG. 10A. As shown, the feedback resistance starts as the total of all resistance in the bank of resistors 710 but steadily falls as the gate voltages of each transistor is raised to turn on each of the transistors in succession. As each transistor is turned on, resistors in the bank of resistors are shorted until only R9 remains.

Figure 10B:
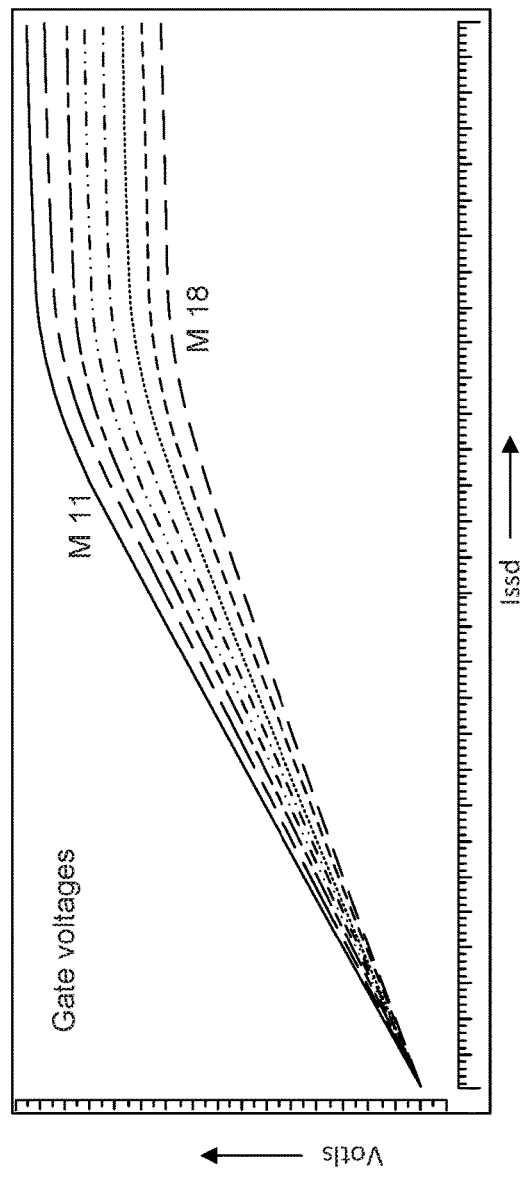
FIG. 10B is a graph of gate voltages at each transistor controlling a resistor in the variable feedback resistor of FIG. 7 during a shutdown period as the soft shutdown control current is increased.

FIG. 10B is a plot of the gate voltages versus time during a shutdown transition (i.e., as the soft shutdown current, Issd, is increased) for the bank of transistors 720 of FIG. 7. In this case (as in FIG. 10A), Issd is linear with time (i.e., is based on a linear ramp wave) thus the x-axis of the plot may also be considered as time. As can be observed, the transistors each reached a threshold voltage to turn ON at a different time. The turn ON time is determined by the voltage divider circuit and the ramp signal applied thereto.

The resistance transition shown in FIG. 10A can be controlled by the divider ratio of the voltage divider circuit and the number of transistors. In other words, the variable resistor may have any number of resistors and transistors, and the resistors in the bank of resistors may the same or different values in order to control the feedback resistance profile in FIG. 10A. The minimum resistance can be set based on the resistance (e.g., R9) with no corresponding transistor and the transistors (M11-18) act as analog switches and respond more smoothly to the transition of Rfb than logical switches.

Figure 11:
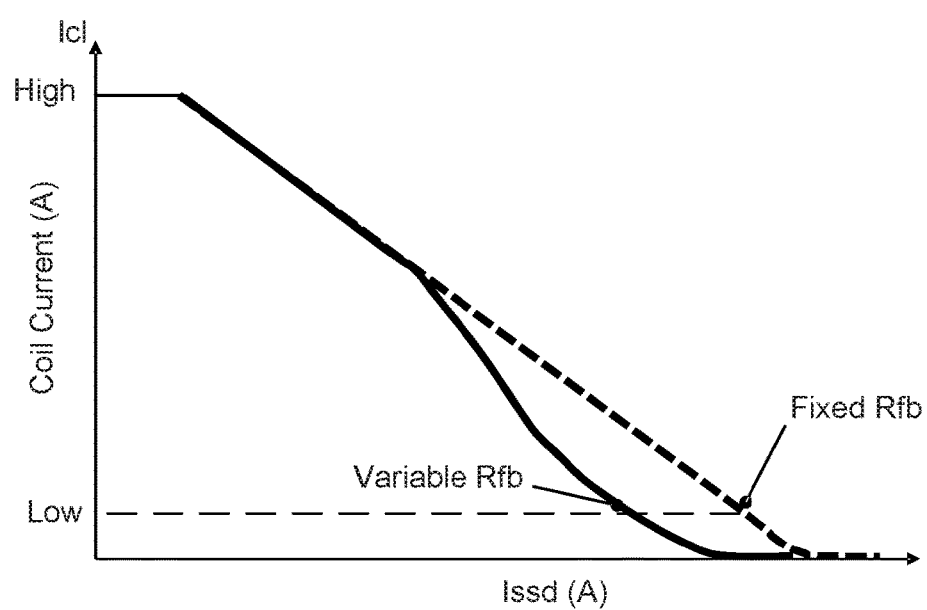
FIG. 11 is a graph of coil current versus control current during soft shutdown for a current limiter circuit having a fixed feedback resistance and for a current limiter circuit having a variable feedback resistance.

FIG. 11 illustrates a comparison between (i) the coil current of the current limiter circuit when the feedback resistance is varied (e.g., by a ramp signal applied to the variable feedback resistor) during a soft shutdown period and (ii) the coil current of the current limiter circuit when feedback resistance is not varied (e.g., by no ramp signal or a constant signal applied to the variable feedback resistor). As shown, the coil current (i.e., dotted line) corresponds linearly to a control current (Issd) from the signal generator for the fixed feedback resistance case for both high coil currents (e.g., approximately 12 amps) and low currents (e.g., approximately 1 amp). The coil current (i.e., solid line) for the variable feedback resistance case, however, corresponds linearly to the control current for high currents (e.g., approximately 12 amps) but does not correspond linearly to the control current for low currents (e.g., approximately 1 amp). In other words, control accuracy is not maintained at low currents because the lowered feedback resistance lowers the open loop gain of the controller. This loss of control accuracy comes with the advantage of an improved phase margin at low currents, and is acceptable as long as the slope of the shutdown profile is not too steep. The particular values of high and low coil currents may vary based on the implementation of the present disclosure. In general, the low coil current can be expressed as a percentage of the high coil current. For example, a low coil current may be approximately 10% of the high coil current.

Figure 12:
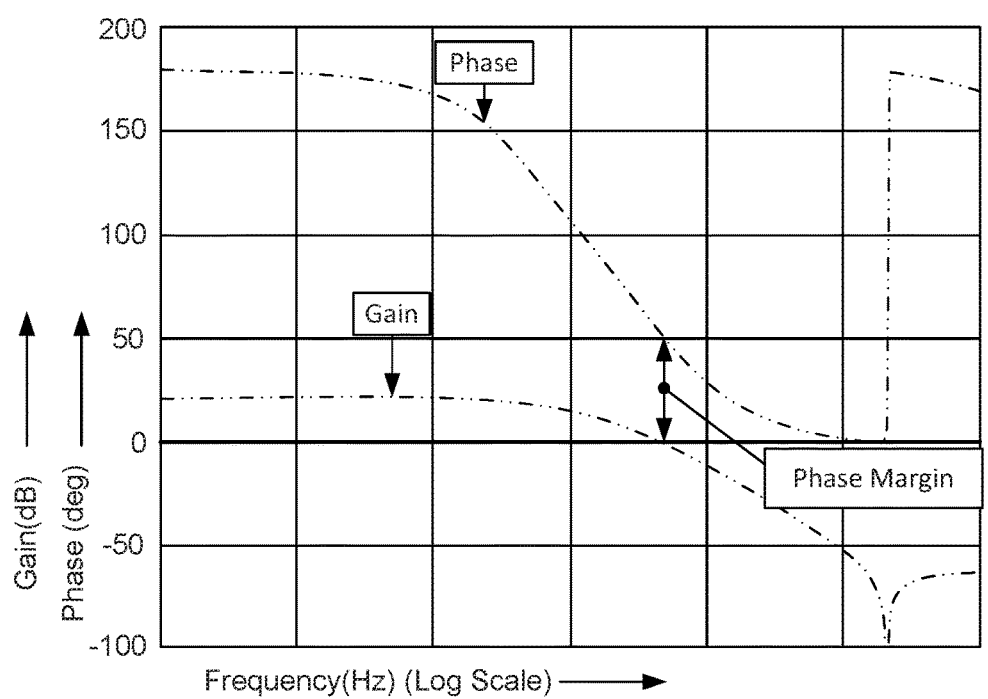
FIG. 12 is a plot of gain and phase versus frequency illustrating an equivalent phase margins in a high current region (12A) of a soft shutdown for both fixed and variable feedback resistance embodiments.

Plots of gain and phase versus frequency (e.g., for a range from 1 Hz to 1 MHz plotted according to a log scale) at a high coil current (12 amps (A)) are shown in FIG. 12. The curves apply for both the fixed feedback resistance and the variable feedback resistance cases because for a high coil current (e.g., 12 A) they can be the same. As shown, the phase margin (i.e., the difference between the gain and phase curves at zero dB gain) for bot the fixed and variable feedback resistance cases at 12A is approximately 50 degrees (e.g., 54.6 degrees).

Figure 13:
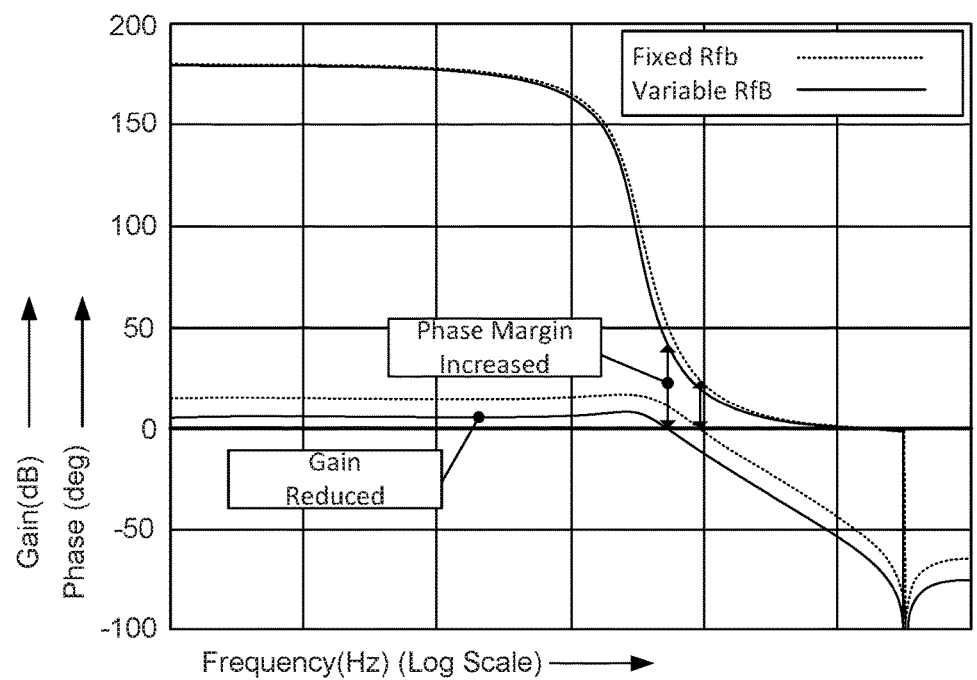
FIG. 13 is a plot of gain and phase versus frequency illustrating different phase margins in a low current region (1A) of a soft shutdown for fixed and variable feedback resistance embodiments.

FIG. 13 illustrates the fixed resistance and variable resistance cases at a low coil current (e.g., 1A). As can be seen (dotted line), the phase margin for the fixed resistance case has decreased from approximately 50 degrees at 12A (see FIG. 12) to about 25 degrees (e.g., 24.8 degrees) at 1A. The reduction in phase margin is due, in part, to a broadening of the bandwidth as the coil current is reduced. The boarding of the bandwidth may be due to operating characteristics of elements in the circuit, such as the IBGT and the inductor (i.e., coil). The phase margin for the variable resistance case, however, has not been reduced nearly as much. The phase margin for the variable resistance case has decreased from approximately 50 degrees at 12A (see FIG. 12) to about 44 degrees (e.g., 44.3 degrees) at 1A. Thus, the circuit has a good phase margin for all coil currents during the soft shutdown. Viewed another way, the reduced gain, increases the phase margin at 1A from about 25 degrees to about 44 degrees.

As can be observed from FIGS. 12 and 13, the DC gain of circuit may change depending on the coil current and the feedback resistance. For example, a high DC gain at a high current (e.g., 20.7 decibels (dB) at 12A) may be reduced to a lower DC gain at a low current (e.g., 14.2 dB at 1A). By changing the feedback resistance the DC gain may be reduced further at a low current (e.g., 5.6 dB at 1A). The results, shown in FIGS. 12 and 13 are presented as an example to aid in understanding. In practice, the particular values of coil current, phase, gain, and phase margin may vary.

Decreasing the loop gain has advantages over other methods for securing phase margin. For example, internal phase compensation is not appropriate for securing phase margin doe to the low frequencies (a few KHz) required for ignition. In this low frequency regime very large resistors and/or capacitors would be required for the compensation, which are not practical.

Figure 14:
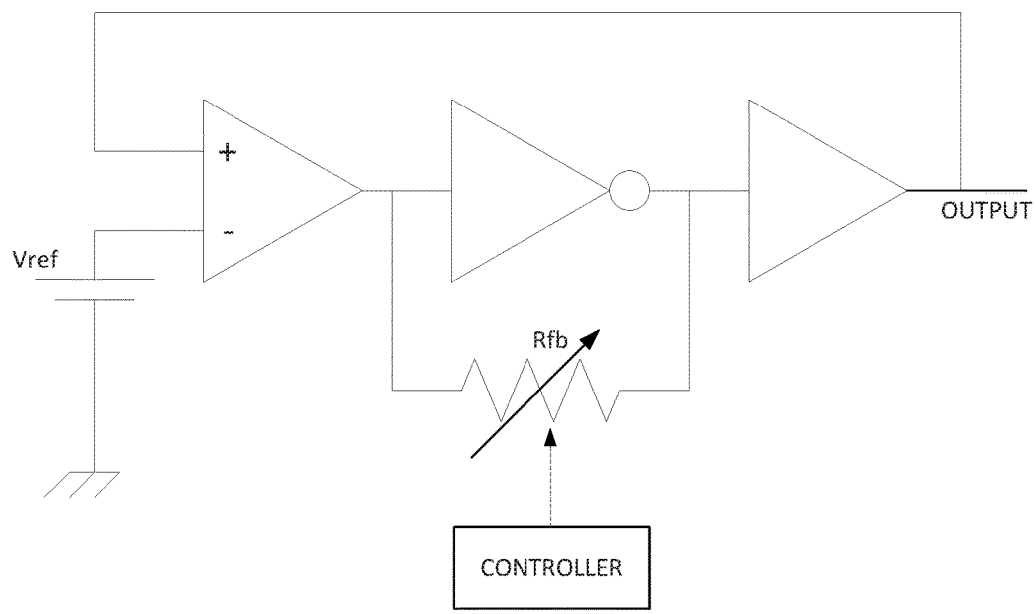
FIG. 14 is a schematic of a circuit in which a loop gain is controllable over operating conditions to adjust the accuracy and stability of the output.

So far, the discussion of the variable feedback resistor for a negative feedback control loop to provide but accuracy with stability at different current levels has been discuss for applications related to ignition system. In general, however, the principles, techniques, and circuits disclosed herein may be applied to other applications that require a negative feedback loop to limit a current over a range. It is envisioned that the stability and accuracy provided by the variable feedback resistance current limiter circuit is suitable for all such applications. Even more generally, the principles of the present disclosure may be applied to a circuit in which a loop gain is controllable over operating conditions to adjust the accuracy and stability of the output. A schematic of this circuit, in which a loop gain is controllable to adjust accuracy and stability of the output, is shown in FIG. 14.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The invention claimed is:

1. A circuit comprising:
a transistor coupled to a coil and configured to allow a coil current to flow through the transistor at a current level that is based on a voltage at a terminal of the transistor;
a current sensor, coupled to the transistor, that senses the current level of the coil current;
a controller configured in a control loop with the current sensor and the transistor that is configured to adjust the voltage at the terminal of the transistor to reduce a difference between the sensed current level and a reference level, wherein the controller has an open loop gain determined by a resistance of a variable feedback resistor; and
a signal generator coupled to the controller that generates a ramp signal to (i) control the reference level of the controller so that the coil current is reduced gradually over a shutdown period and (ii) control the resistance of the variable feedback resistor so that the open loop gain of the controller is reduced over the shutdown period.

2. The circuit according to claim 1, wherein the transistor is an insulated-gate bipolar transistor (IGBT) and the terminal is the gate of the IGBT.

3. The circuit according to claim 2, further comprising a gate driver that is coupled to the gate of the IGBT.

4. The circuit according to claim 1, wherein the coil is part of an ignition coil.

5. The circuit according to claim 4, wherein the ignition coil is for a vehicle.

6. The circuit according to claim 4, wherein the coil current is reduced gradually over the shutdown period to prevent an unwanted spark in the ignition coil during the shutdown period.

7. The circuit according to claim 1, wherein the ramp signal creates a reference voltage that ramps linearly downward during the shutdown period.

8. The circuit according to claim 7, wherein the coil current ramps linearly downward according to the reference voltage when the coil current in is in a high current region but deviates from ramping linearly downward according to the reference voltage when the coil current is in a low current region.

9. The circuit according to claim 1, wherein the current sensor is a resistor in series with the transistor so that the current flowing through the transistor creates a sensed voltage on the resistor.

10. The circuit according to claim 1, wherein the variable feedback resistor is a bank of series connected resistors that are each connected in parallel with a transistor of a bank of transistors so that when a particular transistor in the bank of transistor is turned ON the resistor that is in parallel with the particular transistor is shorted to reduce the resistance of the variable feedback resistor.

11. The circuit according to claim 10, further comprising a transistor control circuit that is coupled to the signal generator, wherein the transistor control circuit includes a voltage divider that is tapped at a different voltages by the gates of each of the transistors in the bank of transistors so that the transistors are successively turned ON according to the ramp signal to reduce the resistance of the variable feedback resistor over the shutdown period.

12. The circuit according to claim 1, wherein the controller includes a differential amplifier coupled to an inverting amplifier, the inverting amplifier having negative feedback through the variable feedback resistor.

13. The circuit according to claim 1, wherein open loop gain of the controller is reduced over the shutdown period to increase a phase margin in a low coil current region of a soft shutdown profile.

14. An ignition system comprising:
an ignition coil that includes a primary coil, a secondary coil and a spark gap;
an insulated-gate bipolar transistor (IGBT) coupled to the primary coil and configured to allow a coil current to flow through the IGBT at a coil current level that is based on a voltage at a gate of the IGBT;
a current sensor coupled to the IGBT that senses the coil current level of the coil current;
a controller configured in a control loop with the current sensor and the IGBT that is configured to adjust the voltage at the gate of the IGBT to reduce a difference between the sensed coil current level and a reference level, wherein the controller has an open loop gain determined by a resistance of a variable feedback resistor;
a signal generator coupled to the controller that generates a ramp signal to (i) control the reference level of the controller so that the coil current level is reduced gradually over a shutdown period and (ii) control the resistance of the variable feedback resistor so that the open loop gain of the controller is reduced over the shutdown period.

15. The ignition system according to claim 14, wherein the variable feedback resistor is a bank of series connected resistors that are each connected in parallel with a transistor of a bank of transistors so that when a particular transistor in the bank of transistor is turned ON the resistor that is in parallel with the particular transistor is shorted to reduce the resistance of the variable feedback resistor.

16. The ignition system according to claim 15, further comprising a transistor control circuit that is coupled to the signal generator, wherein the transistor control circuit includes a voltage divider that is tapped at a different voltages by the gates of each of the transistors in the bank of transistors so that the transistors are successively turned ON according to the ramp signal and the resistance of the variable feedback resistor is reduced over the shutdown period.

17. The ignition system according to claim 14, wherein the controller includes a differential amplifier coupled to an inverting amplifier, the inverting amplifier having negative feedback through the variable feedback resistor.

18. The ignition system according to claim 14, wherein open loop gain of the controller is reduced over the shutdown period to increase a phase margin in a low coil current region of a soft shutdown profile.

19. A method for preventing an unwanted spark in an ignition coil during discharge:
sensing a coil current level in the ignition coil;
comparing the sensed coil current level to a reference level to determine a difference;
amplifying the difference using an inverting amplifier that has negative feedback determined by a variable feedback resistance;
controlling a gate of a transistor that limits the coil current level in the ignition coil based on the amplified difference;
repeating the sensing, the comparing, the amplifying, and the controlling as the reference level is reduced according to a ramp signal so that the coil current level is gradually reduced; and
reducing the feedback resistance as the coil current level is gradually reduced to increase a phase margin.

20. The method for preventing an unwanted spark in an ignition coil during discharge according to claim 19, wherein the reducing the feedback resistance comprises:
successively shorting a bank of resistors according to the ramp signal to reduce the feedback resistance.

* * * * *